United States Patent
Yeh et al.

(10) Patent No.: US 10,852,191 B2
(45) Date of Patent: Dec. 1, 2020

(54) LIGHT SOURCE SYSTEM AND POLARIZATION ANGLE ADJUSTING METHOD

(71) Applicant: Taiwan Semiconductor Manufacturing Co., Ltd., Hsinchu (TW)

(72) Inventors: Jen-Hao Yeh, Hsinchu (TW); Chun-Lin Chang, Zhubei (TW); Han-Lung Chang, Kaohsiung (TW); Li-Jui Chen, Hsinchu (TW); Po-Chung Cheng, Zhongpu Shiang (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/438,710

(22) Filed: Jun. 12, 2019

(65) Prior Publication Data

US 2020/0033194 A1    Jan. 30, 2020

Related U.S. Application Data

(60) Provisional application No. 62/711,675, filed on Jul. 30, 2018.

(51) Int. Cl.
| | |
|---|---|
| *G01J 4/04* | (2006.01) |
| *G02B 27/28* | (2006.01) |
| *G03F 7/20* | (2006.01) |
| *G02B 5/30* | (2006.01) |

(52) U.S. Cl.
CPC ............ *G01J 4/04* (2013.01); *G02B 5/30* (2013.01); *G02B 27/286* (2013.01); *G03F 7/70566* (2013.01)

(58) Field of Classification Search
CPC ....... G02B 5/30; G01J 4/00; G01J 4/02; G01J 4/04; G01J 2004/001
See application file for complete search history.

(56) References Cited

U.S. PATENT DOCUMENTS

| | | | | |
|---|---|---|---|---|
| 4,671,660 | A | * | 6/1987 | Distl ................. G01J 4/00 356/367 |
| 6,166,807 | A | * | 12/2000 | Kawamura ......... G01J 4/00 356/364 |
| 8,764,995 | B2 | | 7/2014 | Chang et al. |
| 8,796,666 | B1 | | 8/2014 | Huang et al. |
| 8,828,625 | B2 | | 9/2014 | Lu et al. |

(Continued)

*Primary Examiner* — Jonathan M Hansen
(74) *Attorney, Agent, or Firm* — McClure, Qualey & Rodack, LLP

(57) ABSTRACT

A light source system is provided. The light source system is capable of measuring a polarization angle and includes a light source configured to emit an original light beam, and the original light beam has an original polarization angle. The light source system further includes an amplifying module configured to amplify the original light beam and generate a forward beam for hitting a target, and the forward beam has a forward polarization angle that is equal to the original polarization angle. The light source system further includes a polarization measurement unit, and the polarization measurement unit includes a first polarization measurement module configured to receive a first return beam and measure a first polarization angle of the first return beam. The first return beam is reflected from the target.

20 Claims, 9 Drawing Sheets

(56) References Cited

U.S. PATENT DOCUMENTS

| | | |
|---|---|---|
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2016/0299080 A1* | 10/2016 | Shiozawa ............... G01N 21/65 |
| 2018/0024243 A1* | 1/2018 | Boyd ...................... G01S 7/499 |
| | | 356/5.01 |
| 2018/0031979 A1* | 2/2018 | Bleeker ............... G03F 7/70033 |

* cited by examiner

FIG. 5

LIGHT SOURCE SYSTEM AND POLARIZATION ANGLE ADJUSTING METHOD

PRIORITY CLAIM AND CROSS-REFERENCE

This application claims the benefit of U.S. Provisional Application No. 62/711,675, filed on Jul. 30, 2018, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 1-100 nm. One type of EUV light source is laser-produced plasma (LPP). LPP technology produces EUV light by focusing a high-power laser beam onto small fuel target droplets to form highly ionized plasma that emits EUV radiation with a peak of maximum emission at 13.5 nm. The EUV light is then collected by a collector and reflected by optics towards a lithography exposure object, e.g., a wafer.

Although existing methods and devices for lithography process have been adequate for their intended purposes, they have not been entirely satisfactory in all respects. Consequently, it would be desirable to provide a solution for ensuring the power of EUV radiation of a EUV light source during lithography process.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 5 shows a block diagram of a light source system according to some embodiments of the present disclosure.

DETAILED DESCRIPTION

Figure 1:
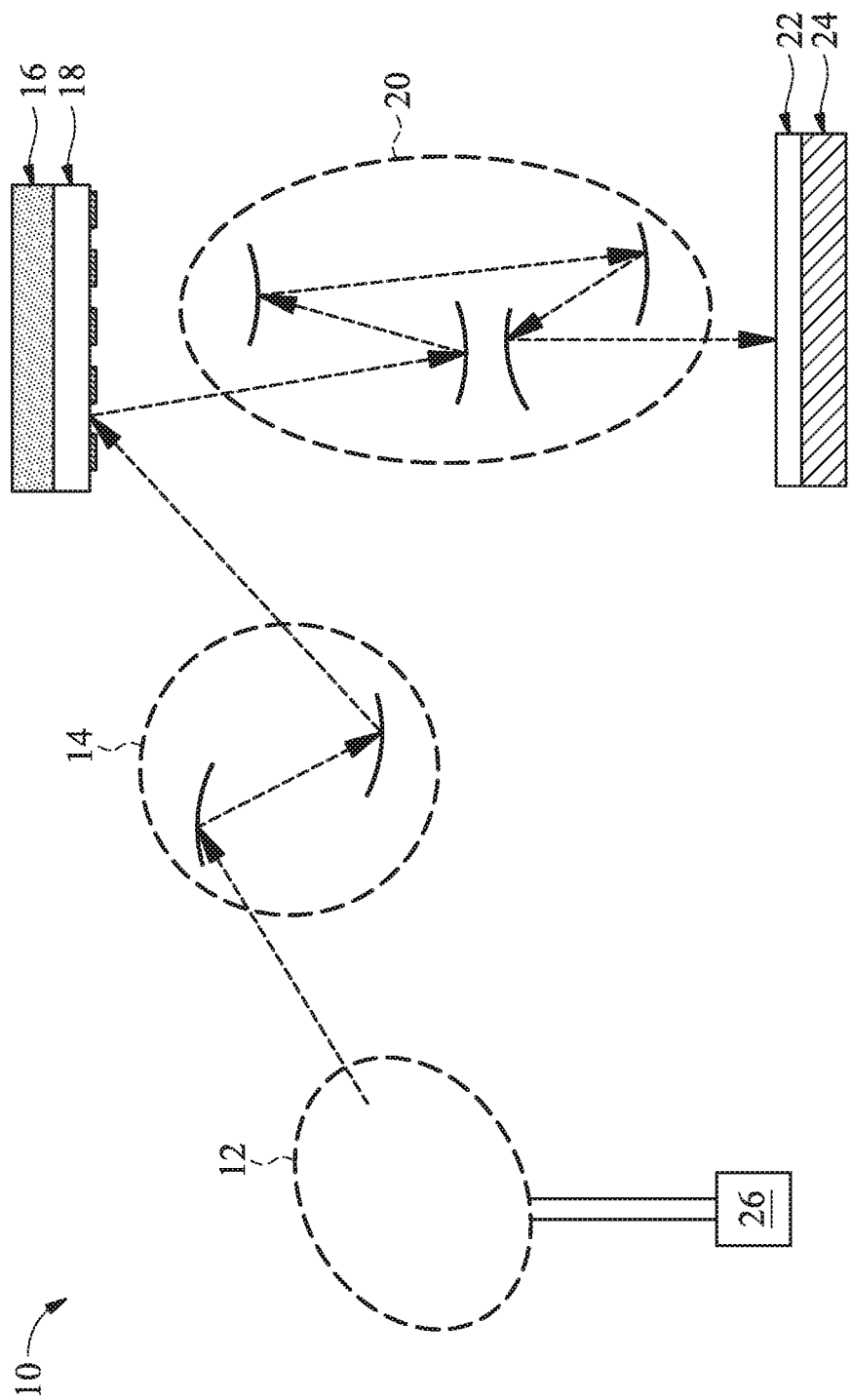
FIG. 1 is a schematic and diagrammatic view of a lithography system, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure is generally related to light source systems and methods. More particularly, it is related to light source systems and methods for effectively adjusting a polarization angle of a return light beam reflected by a target in a EUV lithography process, so that the polarization angle of the return beam emitted to an isolating module can be compensated for immediately, and the wafer throughput of a lithography process using this method can be improved. One challenge in existing light source systems is that the return beam may damage the light source and results in a low power EUV light. An object of the present disclosure is to minimize the time required for adjusting the polarization angle of the return beam, thereby improving the wafer throughput of the lithography process. Another challenge is that one or more reflective mirrors in the light source system may be decayed so that the polarization of the return beam is also affected. Accordingly, another object of the present disclosure is to measure the polarization angle of the return beam effectively.

FIG. 1 is a schematic and diagrammatic view of a lithography system 10, in accordance with some embodiments. The lithography system 10 may also be generically referred to as a scanner that is operable to perform lithographic exposure processes with a respective radiation source and exposure mode.

The lithography system 10 includes a radiation source module 12, an illuminator 14, a mask stage 16, a reticle 18, a projection optics module (or projection optics box (POB)) 20 and a wafer stage 24, in accordance with some embodiments. The elements of the lithography system 10 can be added to or omitted, and the invention should not be limited by the embodiment.

The radiation source module 12 is configured to generate radians having a wavelength ranging between about 1 nm and about 100 nm. In one particular example, the radiation source module 12 generates a EUV light with a wavelength centered at about 13.5 nm. Accordingly, the radiation source module 12 is also referred to as a EUV light source. However, it should be appreciated that the radiation source module 12 should not be limited to emitting EUV light. The radiation source module 12 can be utilized to perform any high-intensity photon emission from excited target material.

In various embodiments, the illuminator 14 includes various optical modules, such as a single lens or a lens system having multiple lenses (zone plates) or alternatively reflective optics (for EUV lithography system), such as a single mirror or a mirror system having multiple mirrors in order to direct light from the radiation source module 12 onto a mask stage 16, particularly to a reticle 18 secured on the mask stage 16. In the present embodiment where the radiation source module 12 generates light in the EUV wavelength range, reflective optics is employed.

The mask stage 16 is configured to secure the reticle 18. In some embodiments, the mask stage 16 includes an electrostatic chuck (e-chuck) to secure the reticle 18. This is because the gas molecules absorb EUV light and the lithography system for the EUV lithography patterning is maintained in a vacuum environment to avoid EUV intensity loss. In the present disclosure, the terms mask, photomask, and reticle are used interchangeably.

In the present embodiment, the reticle 18 is a reflective reticle. One exemplary structure of the reticle 18 includes a substrate with a suitable material, such as a low thermal expansion material (LTEM) or fused quartz. In various examples, the LTEM includes $TiO_2$ doped $SiO_2$, or other suitable materials with low thermal expansion. The reticle 18 includes a reflective multilayer deposited on the substrate.

The reflective multilayer includes a plurality of film pairs, such as molybdenum-silicon (Mo/Si) film pairs (e.g., a layer of molybdenum above or below a layer of silicon in each film pair). Alternatively, the reflective multilayer may include molybdenum-beryllium (Mo/Be) film pairs, or other suitable materials that are configurable to highly reflect the EUV light. The reticle 18 may further include a capping layer, such as ruthenium (Ru), disposed on the reflective multilayer for protection. The reticle 18 further includes an absorption layer, such as a tantalum boron nitride (TaBN) layer, deposited over the reflective multilayer. The absorption layer is patterned to define a layer of an integrated circuit (IC). Alternatively, another reflective layer may be deposited over the reflective multilayer and is patterned to define a layer of an integrated circuit, thereby forming a EUV phase shift reticle.

The projection optics module (or projection optics box (POB)) 20 is configured for imaging the pattern of the reticle 18 on to a semiconductor wafer 22 secured on a wafer stage 24 of the lithography system 10. In some embodiments, the POB 20 has refractive optics (such as for a UV lithography system) or alternatively reflective optics (such as for a EUV lithography system) in various embodiments. The light directed from the reticle 18, carrying the image of the pattern defined on the reticle, is collected by the POB 20. The illuminator 14 and the POB 20 are collectively referred to as an optical module of the lithography system 10.

In the present embodiment, the semiconductor wafer 22 may be made of silicon or another semiconductor material. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV light in the present embodiment. Various components including those described above are integrated together and are operable to perform lithography exposing processes.

The lithography system 10 may further include other modules or be integrated with (or be coupled with) other modules. In the present embodiment, the lithography system 10 includes a gas supply module 26 designed to provide hydrogen gas to the radiation source module 12. The hydrogen gas helps reduce contamination in the radiation source module 12.

Figure 2:
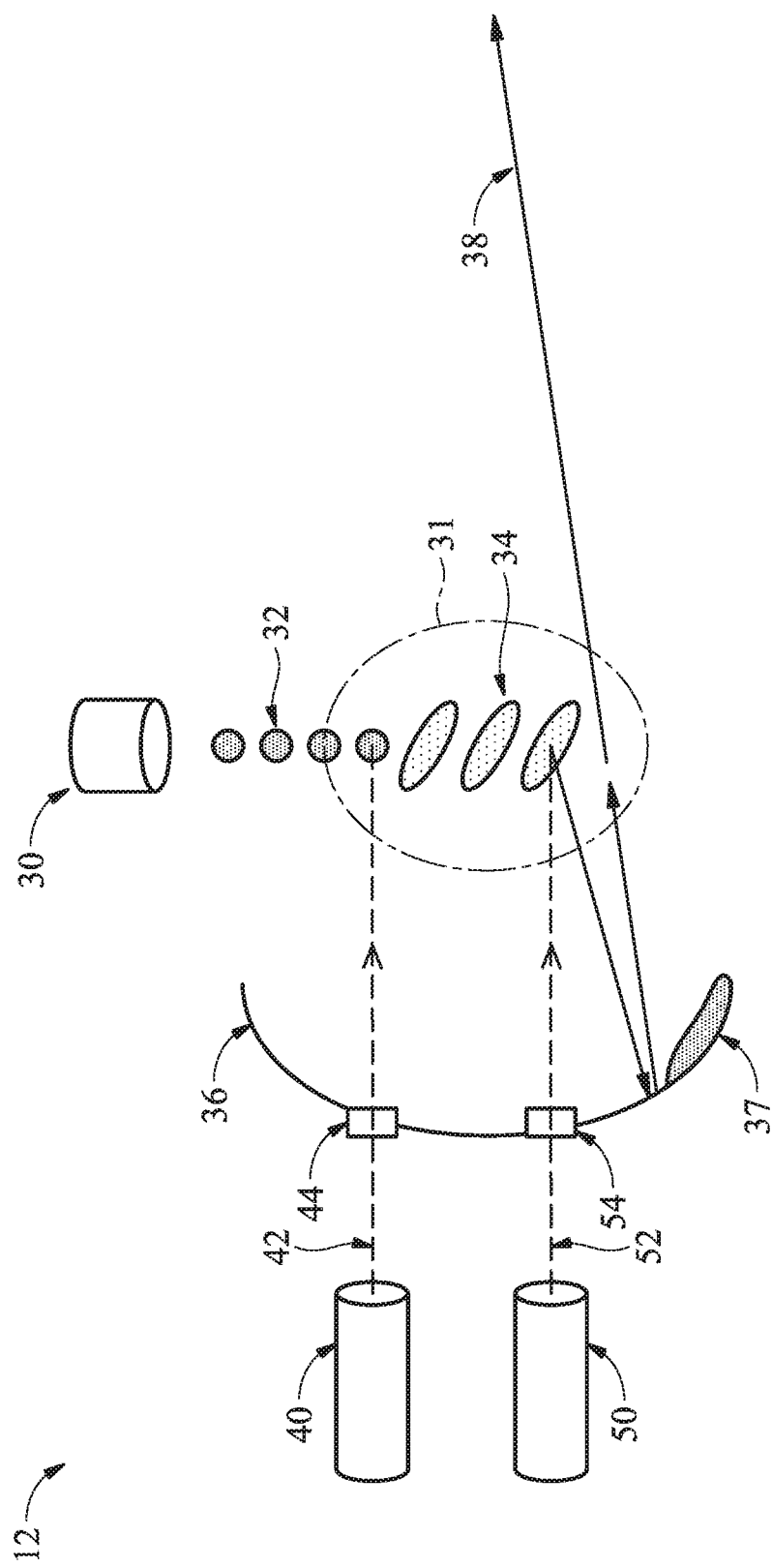
FIG. 2 illustrates a radiation source module in a diagrammatical view, in accordance with some embodiments.

FIG. 2 illustrates the radiation source module 12 in a diagrammatical view, in accordance with some embodiments. The radiation source module 12 employs a dual-pulse laser produced plasma (LPP) mechanism to generate plasma and further generate EUV light from the plasma, but it is not limited thereto.

Referring to FIG. 2, the radiation source module 12 includes a target droplet generator 30, a first laser source 40, a second laser source 50, and a LPP collector 36. The target droplet generator 30 generates a plurality of target droplets 32. In an embodiment, the target droplets 32 are tin (Sn) droplets. In an embodiment, the tin droplets 32 each have a diameter about 30 microns (μm). In an embodiment, the tin droplets 32 are generated at a rate about 50 kilohertz (kHz) and are introduced into a zone of excitation 31 in the radiation source module 12 at a speed about 70 meters per second (m/s). Other material can also be used for the target droplets 32, for example, a tin containing liquid material such as eutectic alloy containing tin, lithium (Li), and xenon (Xe).

The first laser source 40 produces laser pulses 42 (also referred to pre-pulses 42). The second laser source 50 produces laser pulses 52 (also referred to main-pulses 52). In the present embodiment, the laser pulses 42 have less intensity and a smaller spot size than the laser pulses 52. The laser pulse 42 is used to heat (or pre-heat) the target droplet 32 to create a low-density target plume 34, which is subsequently heated (or reheated) by the laser pulse 52, generating increased emission of EUV light. In the present disclosure, the laser pulses 42 are also referred to as the pre-pulses, and the laser pulses 52 the main pulses. In various embodiments, the pre-pulses 42 have a spot size about 100 µm or less, and the main pulses 52 have a spot size of about 200-300 µm, such as 225 µm. The laser pulses 42 and 52 are generated to have certain driving powers to fulfill wafer volume production, such as 125 wafers per hour throughput. In an embodiment, the first laser pulse 42 is equipped with about 2 kilowatts (kW) driving power, and the second laser pulse 52 is equipped with about 19 kW driving power. In various embodiments, the total driving power of the first and second laser pulses, 42 and 52, is at least 20 kW, such as 27 kW. In an embodiment, the first laser source 40 is a carbon dioxide ($CO_2$) laser source. In another embodiment, the first laser source 40 is a neodymium-doped yttrium aluminum garnet (Nd:YAG) laser source. In an embodiment, the second laser source 50 is a $CO_2$ laser source.

The pre-pulses 42 and main pluses 52 are directed through windows (or lens) 44 and 54, respectively, into the zone of excitation 31. The windows 44 and 54 adopt a suitable material substantially transparent to the respective laser beams. The generation of the pre-pulses 42 and main pulses 52 are synchronized with the generation of the target droplets 32. As the target droplets 32 move through the excitation zone 31, the pre-pulses 42 heat the target droplets 32 and transform them into low-density target plumes 34. A delay between the pre-pulse 42 and the main pulse 52 is controlled to allow the target plume 34 to form and to expand to an optimal size and geometry. When the main pulse 52 heats the target plume 34, a high-temperature plasma is generated. The plasma emits EUV radiation 38, which is collected by the collector 36. The collector 36 further reflects and focuses the EUV radiation 38 for the lithography exposing processes. In an embodiment, a droplet catcher (not shown) is installed opposite the target droplet generator 30. The droplet catcher is used for catching excessive target droplets 32. For example, some target droplets 32 may be purposely missed by both the laser pulses 42 and 52.

The collector 36 is designed with proper coating material and shape, functioning as a mirror for EUV collection, reflection, and focus. In some embodiments, the collector 36 is designed to have an ellipsoidal geometry. In some embodiments, the coating material of the collector 36 is similar to the reflective multilayer of the EUV mask 18. In some examples, the coating material of the collector 36 includes a ML (such as a plurality of Mo/Si film pairs) and may further include a capping layer (such as Ru) coated on the ML to substantially reflect the EUV light. In some embodiments, the collector 36 may further include a grating structure designed to effectively scatter the laser beam directed onto the collector 36. For example, a silicon nitride layer is coated on the collector 36 and is patterned to have a grating pattern.

Figure 3:
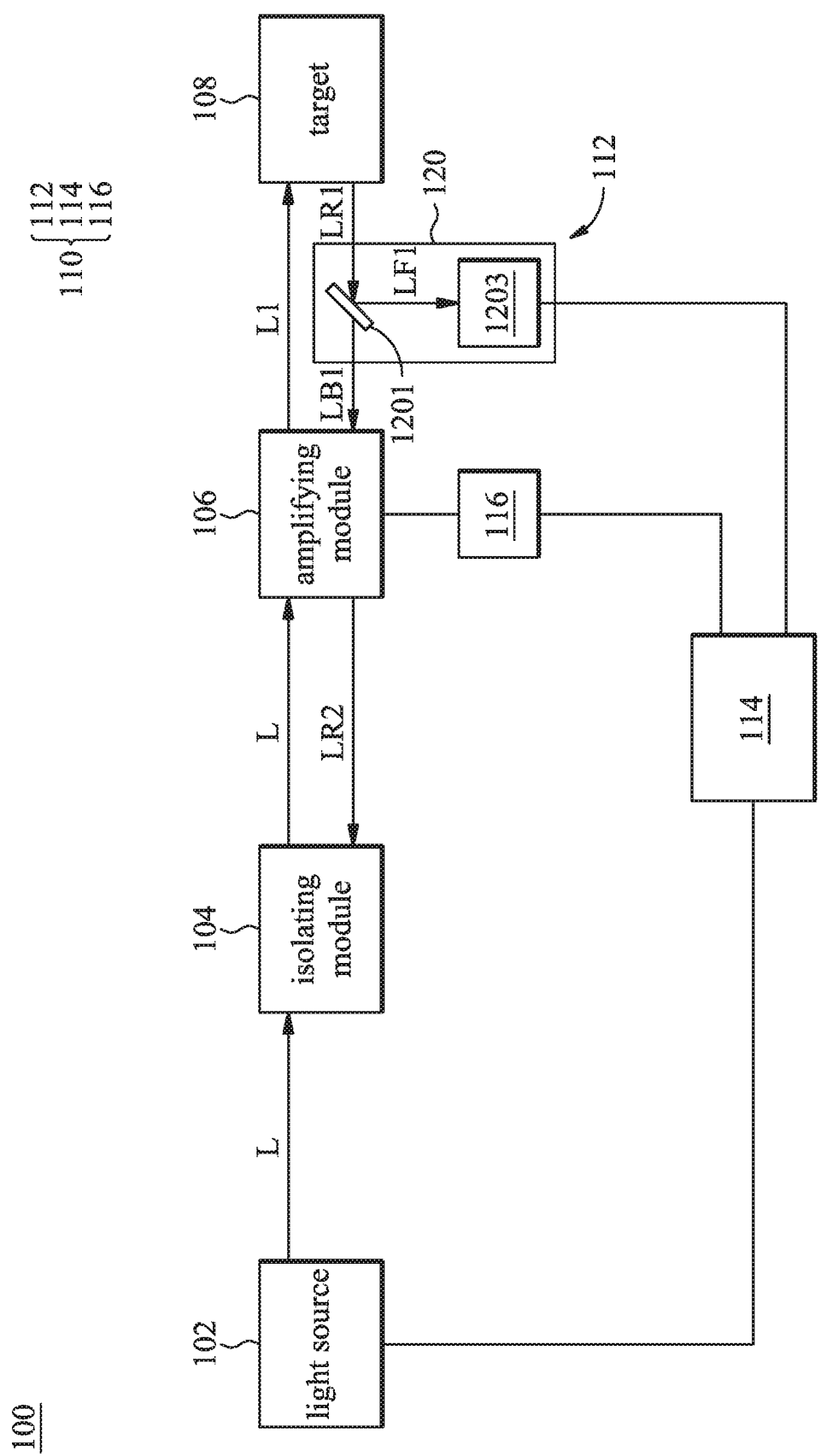
FIG. 3 shows a block diagram of a light source system according to some embodiments of the present disclosure.

Please refer to FIG. 3, which shows a block diagram of a light source system 100 according to some embodiments of the present disclosure. The light source system 100 is similar to the radiation source module 12 in FIG. 2. In this embodiment, the light source system 100 may include a light source 102, an isolating module 104, an amplifying module 106 and a polarization measurement and monitoring device 110. The light source 102 may include the first laser source 40 and the second laser source 50, and a target 108 may be one of the target droplets 32 in FIG. 2.

As shown in FIG. 3, the isolating module 104 is disposed between the light source 102 and the amplifying module 106, and the amplifying module 106 is disposed between the isolating module 104 and the target 108. The light source 102 is configured to emit an original light beam L, and the original light beam L has an original polarization angle. The original light beam L passes through the isolating module 104 to the amplifying module 106.

The amplifying module 106 is configured to amplify power of the original light beam L and then generates a forward beam L1, similar to the laser pulses 42, for hitting the target 108, and the forward beam L1 has a forward polarization angle which is equal to the original polarization angle. After the forward beam L1 hits the target 108, a first return beam LR1 is reflected by the target 108.

As shown in FIG. 3, the polarization measurement and monitoring device 110 includes a polarization measurement unit 112, a monitoring module 114 and a phase adjusting module 116. The polarization measurement and monitoring device 110 is configured to measure a first polarization angle of the first return beam LR1 and adjust a second polarization angle of a second return beam LR2. The second return beam LR2 is emitted from the amplifying module 106 after the amplifying module 106 receives a part of the first return beam LR1. That is, the second return beam LR2 is caused by the first return beam LR1.

In this embodiment, the polarization measurement unit 112 may include a first polarization measurement module 120. The first polarization measurement module 120 is disposed between the amplifying module 106 and the target 108, and the first polarization measurement module 120 includes a first beam splitter 1201 and a first polarization measurement tool 1203. The first beam splitter 1201 is configured to split the first return beam LR1 into a first reflected beam LF1 and a first backward beam LB1 (a part of the first return beam LR1). The first polarization measurement tool 1203 is configured to receive the first reflected beam LF1, so as to measure the first polarization angle of the first reflected beam LF1.

It should be noted that the first return beam LR1, the first reflected beam LF1 and the first backward beam LB1 have the same polarization angle (the first polarization angle), and the second polarization angle of the second return beam LR2 is equal to the first polarization angle in this embodiment.

In some embodiments, the difference between the forward polarization angle and the first polarization angle is substantially 180 degrees, For example, the forward polarization angle (equal to the original polarization angle) is 90 degrees, and the second polarization angle (equal to the first polarization angle) is 270 degrees. Therefore, when a polarization parameter of the isolating module 104 is 270 degrees, the isolating module 104 is able to block the second return beam LR2.

However, in some embodiments, the difference between the forward polarization angle and the first polarization angle may not be 180 degrees. For example, the forward polarization angle (equal to the original polarization angle) is 90 degrees, and the second polarization angle (equal to the first polarization angle) is 280 degrees. Therefore, when the polarization parameter of the isolating module 104 is 270 degrees, the isolating module 104 is not able to block the second return beam LR2 having the second polarization angle of 280 degrees.

In order to effectively block the second return beam LR2, the phase adjusting module 116 is provided to adjust the second polarization angle, so that the isolating module 104 is able to block the second return beam LR2 from entering the light source 102, so as to prevent the light source 102 from being damaged and prevent the EUV energy from being impacted by power of the second return beam LR2.

In this embodiment, the monitoring module 114 of the polarization measurement and monitoring device 110 is coupled to the phase adjusting module 116 and the light source 102, and the monitoring module 114 is configured to monitor the original polarization angle and the first polarization angle so as to control the phase adjusting module 116 to adjust the second polarization angle.

For example, when the monitoring module 114 determines that the difference between the forward polarization angle (such as 90 degrees) and the first polarization angle (such as 280 degrees) is not substantially 180 degrees, the monitoring module 114 controls the phase adjusting module 116 to adjust the second polarization angle to be 270 degrees, so that the difference between the forward polarization angle and the first polarization angle is 180 degrees.

Figure 4:
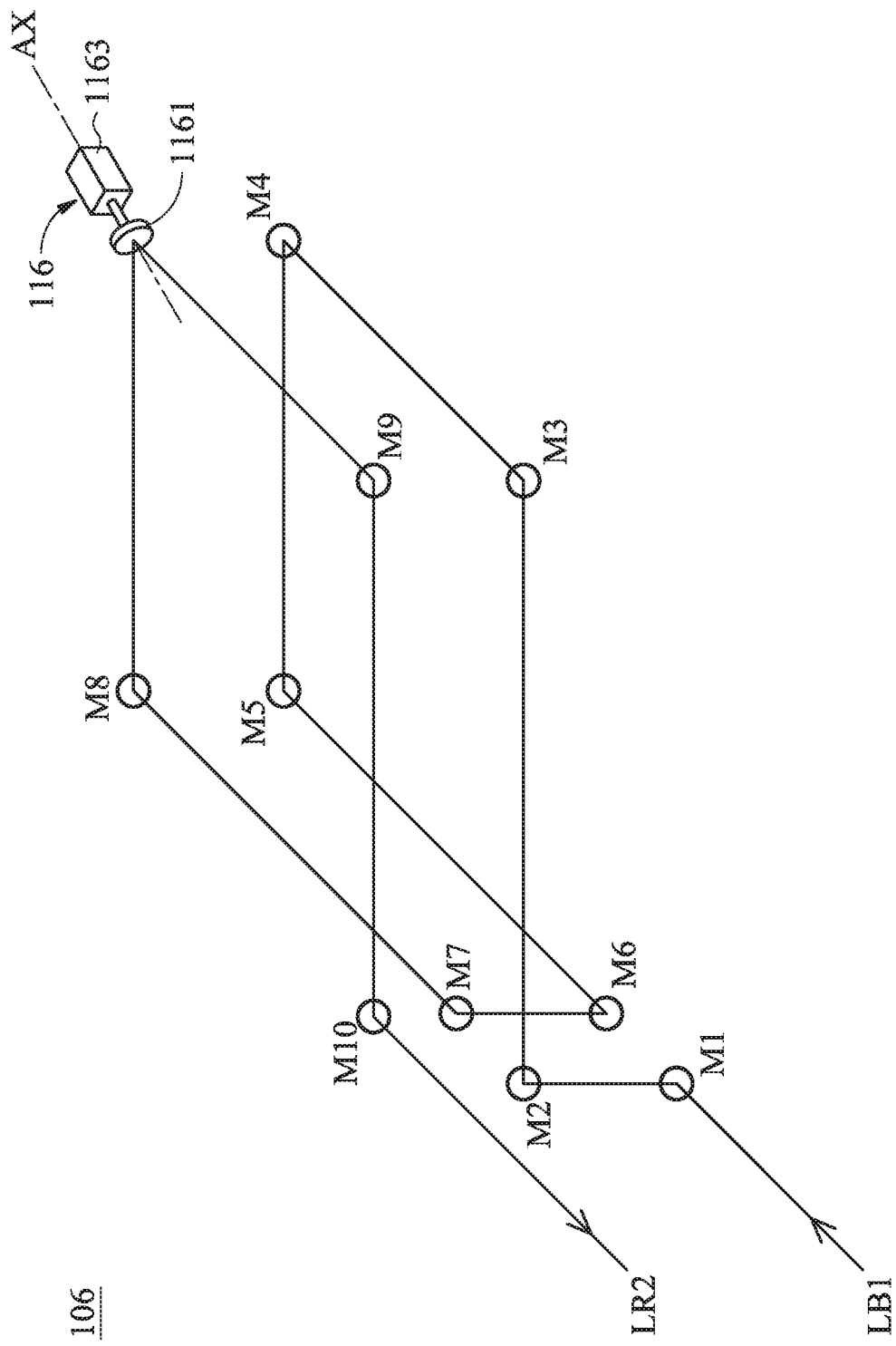
FIG. 4 is a diagram of a part of the amplifying module and the amplifying module according to some embodiments of the present disclosure.

Please refer to FIG. 3 and FIG. 4 together. FIG. 4 is a diagram of a part of the amplifying module 106 and the phase adjusting module 116 according to some embodiments of the present disclosure. As shown in FIG. 4, the amplifying module 106 may include tens reflective mirrors M1 to M10. The first backward beam LB1 entering the amplifying module 106 is reflected by the reflective mirrors M1 to M10 in order, and the second return beam LR2 is emitted from the reflective mirror M10.

The phase adjusting module 116 is disposed between the reflective mirrors M8 and M9 along the path of the first backward beam LB1. In this embodiment, the phase adjusting module 116 may include a reflective phase retarder 1161 and a driving mechanism 1163 which is coupled to the reflective phase retarder 1161. It should be noted that the position of the phase adjusting module 116 is not limited to this embodiment.

The reflective phase retarder 1161 may be a mirror with a specific coating, and the driving mechanism 1163 may be a rotation motor for rotating the reflective phase retarder 1161. For example, the driving mechanism 1163 may drive the reflective phase retarder 1161 to rotate around a rotating axis AX, so as to adjust a polarization angle of a light beam (such as the second return beam LR2).

In this embodiment, the monitoring module 114 can include a controller, and the controller may be a computer system. In one example, the computer system includes a processor and a system memory component. In accordance with embodiments of the present disclosure, the computer system performs specific operations via a processor executing one or more sequences of one or more instructions contained in a system memory component.

The processor may include a digital signal processor (DSP), a microcontroller (MCU), and a central processing unit (CPU). The system memory component may include a random access memory (RAM) or another dynamic storage device or read only memory (ROM) or other static storage devices, for storing data and/or instructions to be executed by the processor.

In this embodiment, the system memory component can store a mapping table regarding the difference between the polarization angles (the forward polarization angle and the first polarization angle) and parameters for controlling the amplifying module 106. For example, when the difference between the polarization angles is A1 degrees, the monitoring module 114 can control the amplifying module 106 to correspondingly rotate B1 degrees, so that the difference between the polarization angles can be returned to 180 degrees. Therefore, as long as the difference between the polarization angles is obtained, compensation can be performed immediately, so that the isolating module 104 can effectively block the light beam from returning to the light source 102, thereby affecting the power of the EUV light generated by the light source system 100.

Figure 5:
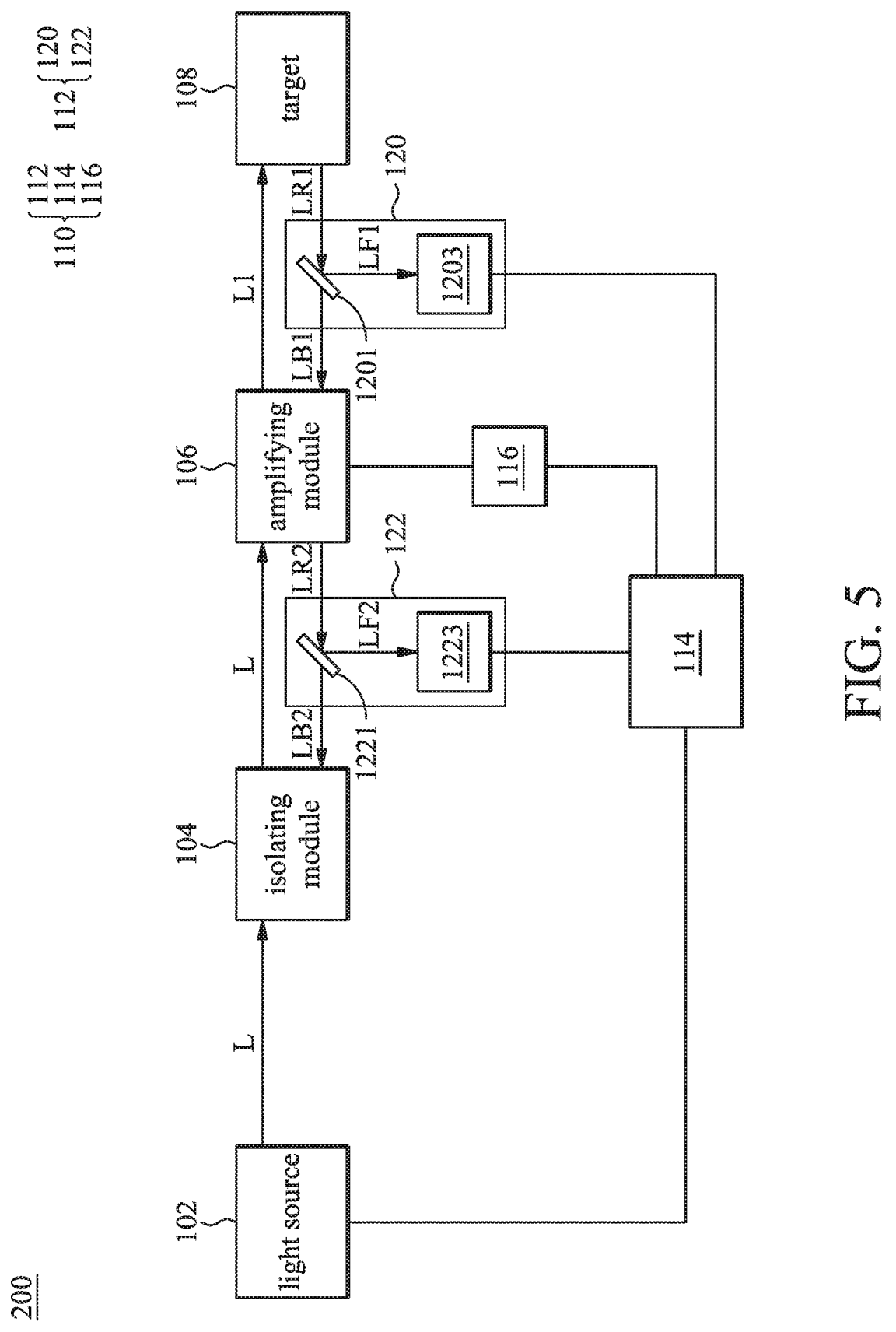

Please refer to FIG. 5, which shows a block diagram of a light source system 200 according to some embodiments of the present disclosure. In this embodiment, the polarization measurement unit 112 further includes a second polarization measurement module 122, and the second polarization measurement module 122 is disposed between the amplifying module 106 and the isolating module 104.

Similar to the first polarization measurement module 120, the second polarization measurement module 122 includes a second beam splitter 1221 and a second polarization measurement tool 1223. The second beam splitter 1221 is configured to split the second return beam LR2 into a second reflected beam LF2 and a second backward beam LB2. The second polarization measurement tool 1223 is configured to receive the second reflected beam LF2, so as to measure the second polarization angle of the second reflected beam LF2.

It should be noted that the second return beam LR2, the second reflected beam LF2 and the second backward beam LB2 have the same polarization angle (the second polarization angle).

In this embodiment, the monitoring module 114 is configured to monitor the original polarization angle, the first polarization angle and the second polarization angle and controls the phase adjusting module 116 to adjust the second polarization angle.

The monitoring module 114 is configured to determine whether the difference between the forward polarization angle and the first polarization angle is substantially 180 degrees (i.e., within a range from 180+2.5 degrees to 180−2.5 degrees). When the difference between the forward polarization angle and the first polarization angle may not be 180 degrees, for example, the forward polarization angle (equal to the original polarization angle) is 90 degrees, and the first polarization angle is 280 degrees, the monitoring module 114 can control the phase adjusting module 116 to adjust the second polarization angle. Then, the monitoring module 114 can monitor the second polarization angle after adjustment to determine whether the second polarization angle after adjustment is 270 degrees, so as to make sure that the isolating module 104 can block the second backward beam LB2.

In some embodiments, one or more reflective mirrors (such as the reflective mirrors M1 to M10 in FIG. 4) may be damaged due to receiving the original light beam L for a long period of time. As a result, the first polarization angle of the first backward beam LB1 may not be the same as the second polarization angle of the second return beam LR2.

In this situation, the monitoring module 114 can also control the phase adjusting module 116 to adjust the second polarization angle. For example, the difference between the forward polarization angle and the first polarization angle is 180 degrees, but the second polarization angle measured by the second polarization measurement module 122 is not equal to the first polarization angle. The monitoring module 114 can control the phase adjusting module 116 to compensate for the second polarization angle of the second return beam LR2, so that the second polarization angle can be adjusted to be equal to the first polarization angle.

Figure 6:
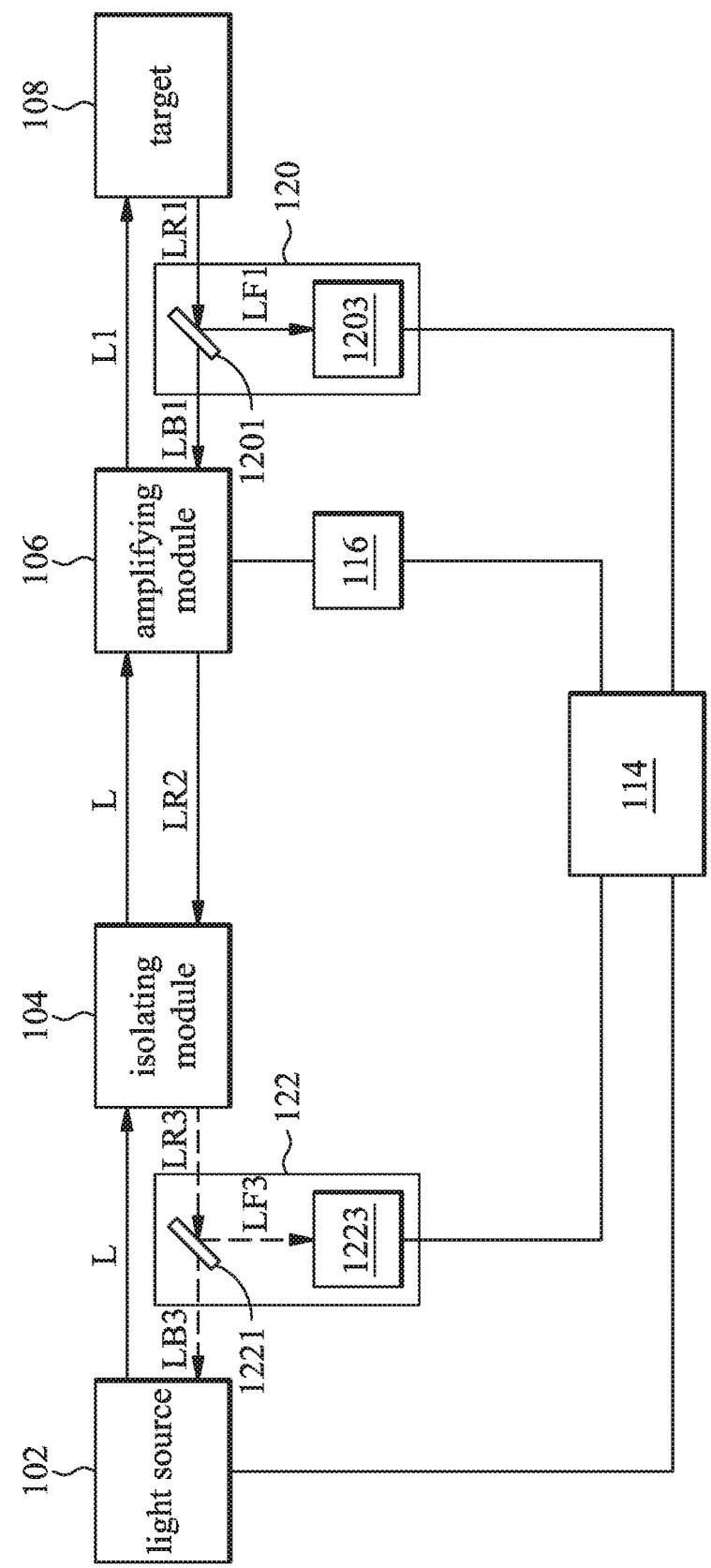
FIG. 6 shows a block diagram of a light source system according to some embodiments of the present disclosure.

Please refer to FIG. 6, which shows a block diagram of a light source system 300 according to some embodiments of the present disclosure. In this embodiment, the second polarization measurement module 122 of the polarization measurement unit 112 is disposed between the light source 102 and the isolating module 104.

As shown in FIG. 6, if the isolating module 104 does not effectively block the second return beam LR2, a third return beam LR3 is emitted from the isolating module 104. In this embodiment, the third return beam LR3 has a third polarization angle which is equal to the second polarization angle of the second return beam LR2 and the first polarization angle.

In addition, the second beam splitter 1221 is configured to split the third return beam LR3 into a third reflected beam LF3 and a third backward beam LB3. The second polarization measurement tool 1223 is configured to receive the third reflected beam LF3, so as to measure the third polarization angle of the third reflected beam LF3.

It should be noted that the third return beam LR3, the third reflected beam LF3 and the third backward beam LB3 have the same polarization angle (the third polarization angle).

In this embodiment, the monitoring module 114 is configured to monitor the original polarization angle, the first polarization angle and the third polarization angle and controls the phase adjusting module 116 to adjust the second polarization angle.

The difference between the forward polarization angle and the first polarization angle may not be 180 degrees, for example, the forward polarization angle (equal to the original polarization angle) is 90 degrees, and the first polarization angle is 280 degrees. Therefore, the isolating module 104 cannot block the second return beam LR2, and the second polarization measurement module 122 receives the third return beam LR3. Then, the monitoring module 114 can control the phase adjusting module 116 to adjust the second polarization angle according to the third polarization angle and the forward polarization angle.

As a result, the monitoring module 114 can monitor whether the second polarization measurement module 122 receives the third return beam LR3 to determine whether the second polarization angle after adjustment is 270 degrees, so as to make sure that the isolating module 104 can block the second return beam LR2.

Figure 7:
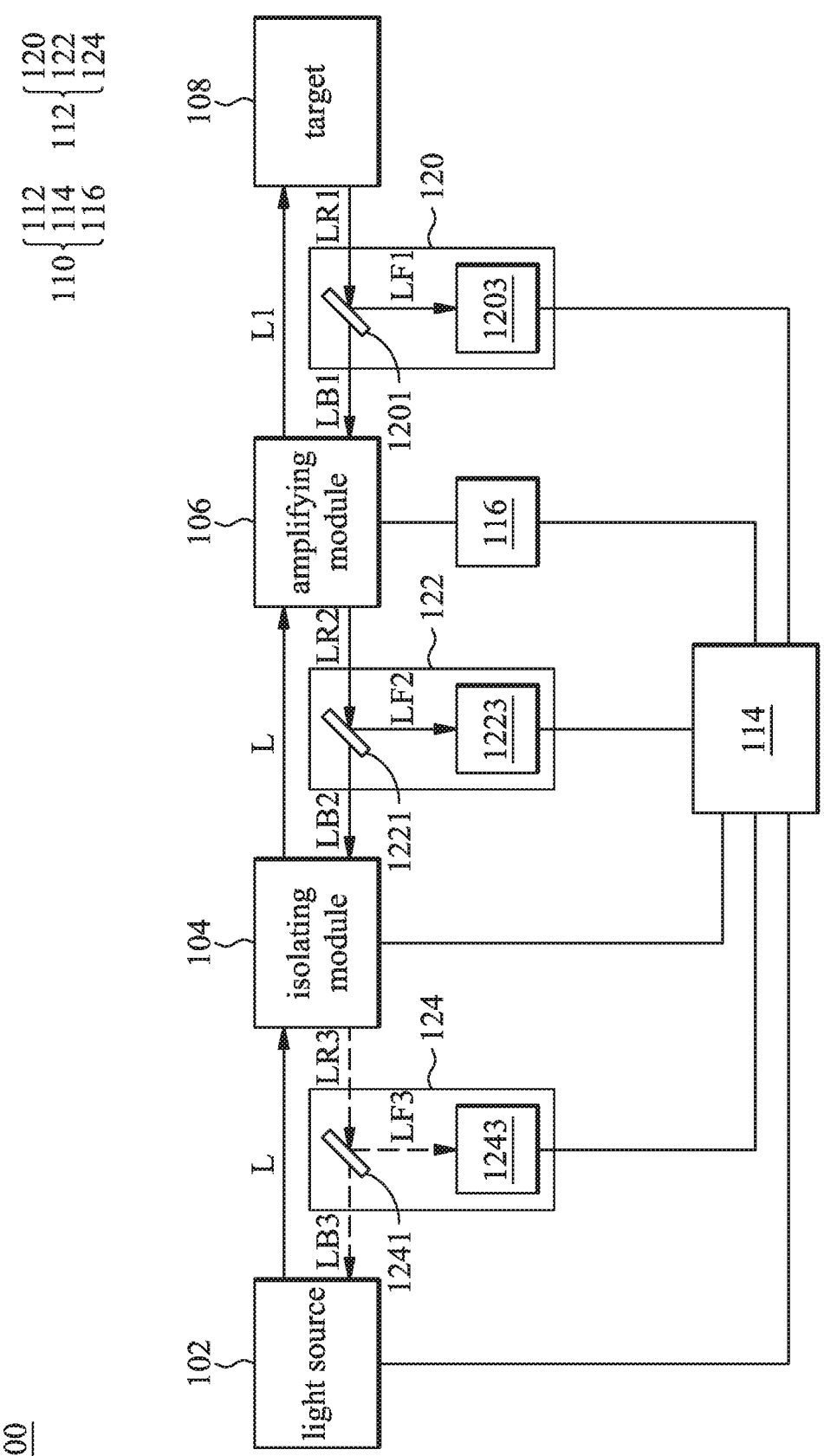
FIG. 7 shows a block diagram of a light source system according to some embodiments of the present disclosure.

Please refer to FIG. 7, which shows a block diagram of a light source system 400 according to some embodiments of the present disclosure. Similar to the light source system 200 in FIG. 5, the polarization measurement and monitoring device 110 further includes a third polarization measurement module 124 in this embodiment. The third polarization measurement module 124 is disposed between the light source 102 and the isolating module 104, and the third polarization measurement module 124 includes a third beam splitter 1241 and a third polarization measurement tool 1243.

The third beam splitter 1241 is configured to split the third return beam LR3 into the third reflected beam LF3 and the third backward beam LB3, and the third polarization measurement tool 1243 is configured to receive the third reflected beam LF3, so as to measure the third polarization angle.

Similar to the previous embodiments, the monitoring module 114 can monitor the original polarization angle, the first polarization angle, the second polarization angle and the third polarization angle and controls the phase adjusting module 116 to adjust the second polarization angle, so that the isolating module 104 can block the second backward beam LB2. The method of adjusting the second polarization angle is similar to the previous embodiment and therefore a detailed description is omitted herein.

In some embodiments, the isolating module 104 may become damaged, causing problems with deviation between the polarization angle of a light beam that can be blocked by the isolating module 104 and the polarization parameter. For example, the polarization parameter is 270 degrees, but the isolating module 104 blocks a light beam with 260 degrees. At this time, the monitoring module 114 can monitor the problem of the isolating module 104 using the third polarization measurement module 124 and the second polarization measurement module 122, and then it can adjust the polarization parameter of the isolating module 104 accordingly. For example, when the deviation of the isolating module 104 is a linear deviation, the monitoring module 114 can adjust the polarization parameter of the isolating module 104 as 280 degrees, so that the isolating module 104 can actually block the light beam with 270 degrees.

Figure 8A:
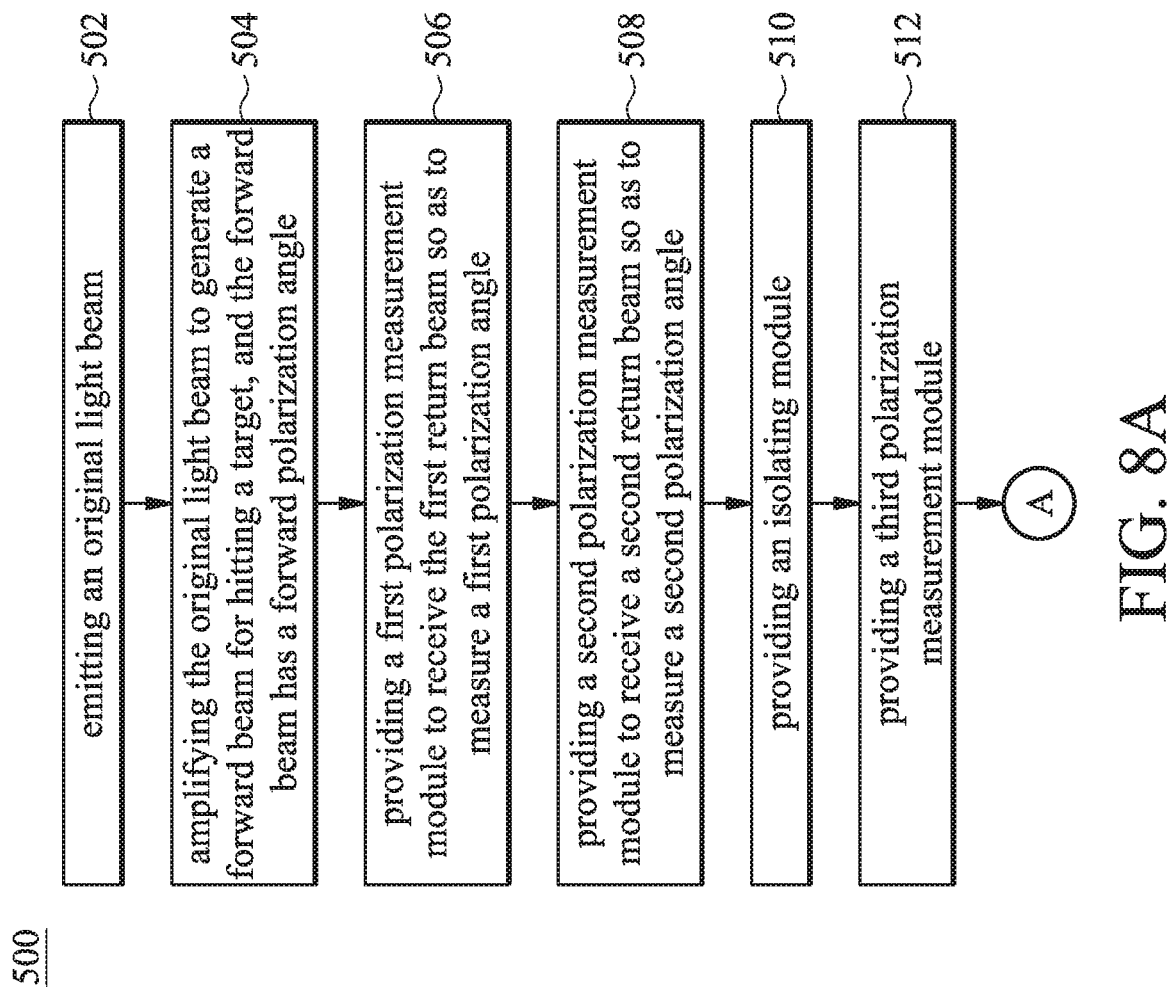
FIG. 8A and FIG. 8B show a flow chart of polarization angle adjusting method according to some embodiments of the present disclosure.
Figure 8B:
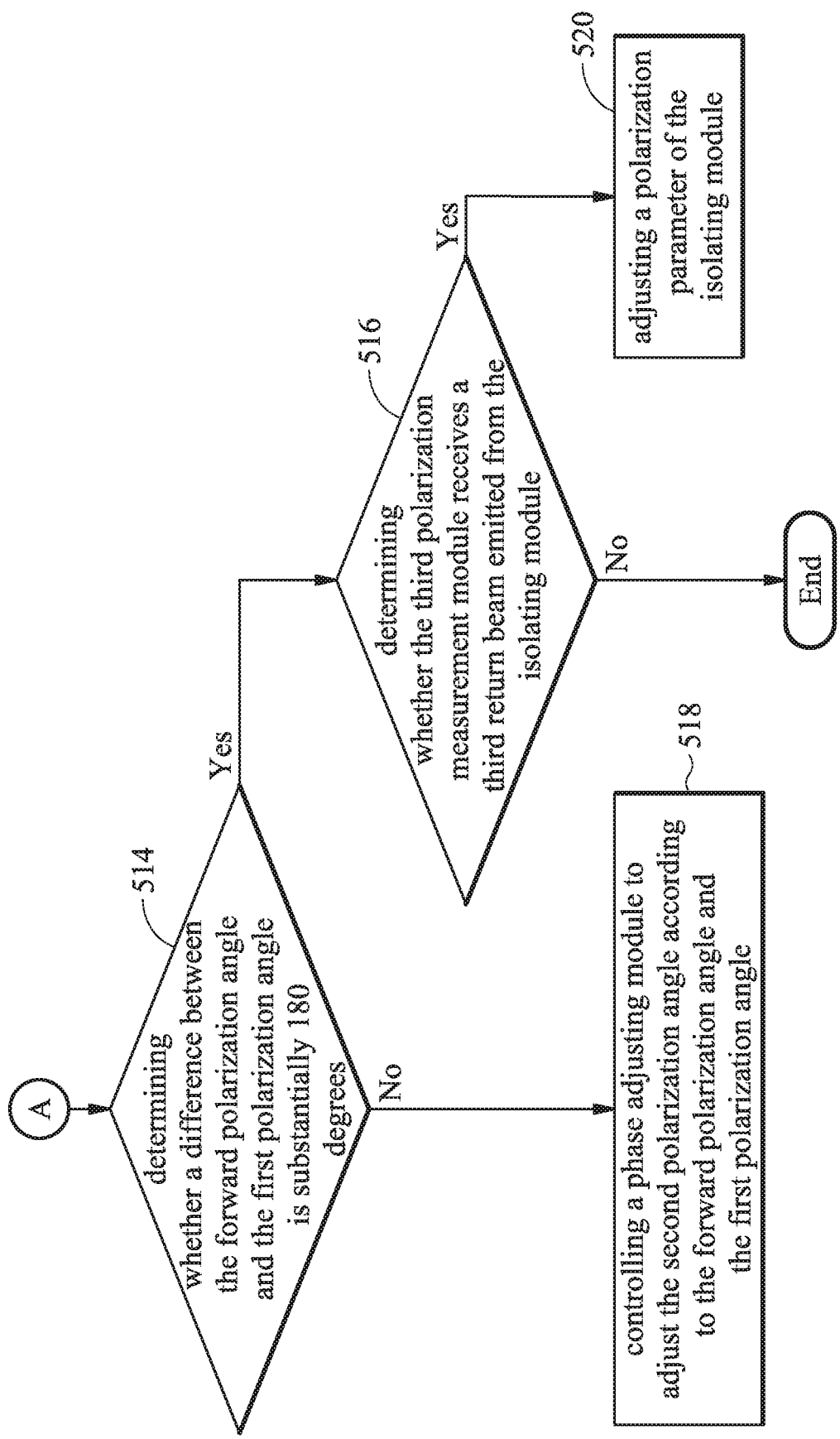

Please refer to FIG. 8A and FIG. 8B, which show a flow chart of polarization angle adjusting method 500 according to some embodiments of the present disclosure. The method 500 includes operation 502, in which the light source emits an original light beam. For example, as shown in FIG. 7, the light source 102 emits the original light beam L to the amplifying module 106 through the isolating module 104.

The method 500 also includes operation 504 in which the amplifying module 106 amplifies the original light beam L to generate a forward beam L1 for hitting a target (such as the target 108), so that the target 108 reflects the first return beam LR1 after being hit, and the forward beam L1 has a forward polarization angle.

The method 500 also includes operation 506 in which the first polarization measurement module 120 is provided to receive the first return beam LR1 so as to measure the first polarization angle of the first return beam LR1.

In addition, the method 500 also includes operation 508 in which the second polarization measurement module 122 is provided to receive the second return beam LR2 so as to measure the second polarization angle of the second return beam LR2.

In operation 510, the isolating module 104 is provided, and the isolating module 104 is disposed between the light source 102 and the amplifying module 106.

The method 500 also includes operation 512 in which the third polarization measurement module 124 is provided. As shown in FIG. 7, the third polarization measurement module 124 is disposed between the light source 102 and the isolating module 104.

The method 500 also includes operation 514 in which the monitoring module 114 determines whether the difference between the forward polarization angle and the first polarization angle is substantially 180 degrees. If the difference between the forward polarization angle and the first polarization angle is substantially 180 degrees, operation 516 is performed. If the difference between the forward polarization angle and the first polarization angle is not substantially 180 degrees, operation 518 is performed.

In operation 516, the monitoring module 114 determines whether the third polarization measurement module 124 receives the third return beam LR3. The third return beam LR3 is emitted from the isolating module 104.

If the third polarization measurement module 124 receives the third return beam LR3, operation 520 is performed. If the third polarization measurement module 124 does not receive the third return beam LR3, method 500 is ended.

In operation 520, in response to the third polarization measurement module 124 receiving the third return beam LR3, the monitoring module 114 adjusts the polarization parameter of the isolating module 104.

In operation 518, the monitoring module 114 controls the phase adjusting module 116 to adjust the second polarization angle. For example, the monitoring module 114 controls the phase adjusting module 116 to adjust the second polarization angle according to the forward polarization angle, the first polarization angle and the second polarization angle before adjustment.

Embodiments of the present disclosure can provide light source systems and methods for compensating for a polarization angle of a return light beam reflected by a target in a EUV lithography process. Based on the design of the light source systems of the present disclosure, the polarization measurement unit 112 can measure the polarization angles of the return beams emitted from the target 108, the amplifying module 106 and the isolating module 104 respectively. That is, the light source system can monitor the polarization angle immediately and adjusts the polarization angle of the return beam emitted to the isolating module 104, so that the isolating module 104 can block the return beam from entering the light source 102 to damage the light source 102.

Therefore, it does need to stop the lithography process for modifying the reflective mirrors in the amplifying module 106, and the time required for adjusting the polarization angle by the phase adjusting module 116 of the present disclosure can be greatly reduced. For example, the time of process for adjusting the polarization angle can be reduced from 48 hours to 2 hours using the light source systems.

In accordance with some embodiments, a light source system is provided. The light source system is capable of measuring a polarization angle and includes a light source configured to emit an original light beam, and the original light beam has an original polarization angle. The light source system further includes an amplifying module configured to amplify the original light beam and generate a forward beam for hitting a target, and the forward beam has a forward polarization angle that is equal to the original polarization angle. The light source system further includes a polarization measurement unit, and the polarization measurement unit includes a first polarization measurement module configured to receive a first return beam and measure a first polarization angle of the first return beam. The first return beam is reflected from the target.

In accordance with some embodiments, a light source system is provided. The light source system includes a light source configured to emit an original light beam, and the original light beam has an original polarization angle. The light source system further includes an amplifying module configured to amplify the original light beam and generate a forward beam for hitting a target, and the forward beam has a forward polarization angle that is equal to the original polarization angle. The light source system also includes an isolating module disposed between the light source and the amplifying module. The light source system further includes a polarization measurement and monitoring device configured to measure a first polarization angle of a first return beam and adjust a second polarization angle of a second return beam. The first return beam is reflected from the target, and the second return beam is emitted from the amplifying module.

In accordance with some embodiments, a polarization angle adjusting method is provided. The method includes emitting an original light beam. The method further includes amplifying, by an amplifying module, the original light beam to generate a forward beam for hitting a target. The target reflects a first return beam after being hit, and the forward beam has a forward polarization angle. The method further includes providing a first polarization measurement module to receive the first return beam so as to measure a first polarization angle of the first return beam. The method also includes providing a second polarization measurement module to receive a second return beam so as to measure a second polarization angle of the second return beam. In addition, the method includes controlling a phase adjusting module to adjust the second polarization angle according to the forward polarization angle and the first polarization angle.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A light source system, capable of measuring a polarization angle, comprising:
    a light source, configured to emit an original light beam, wherein the original light beam has an original polarization angle;
    an amplifying module, including reflective mirrors and configured to amplify the original light beam and generate a forward beam for hitting a target, wherein the forward beam has a forward polarization angle that is equal to the original polarization angle;
    a polarization measurement unit, including a first polarization measurement module, wherein the first polarization measurement module includes a first beam splitter and is configured to receive a first return beam and measure a first polarization angle of the first return beam, wherein the first return beam is reflected from the target; and
    a phase adjusting module, including a reflective phase retarder and configured to adjust a second polarization angle of a second return beam according to the forward polarization angle and the first polarization angle, wherein the second return beam is emitted from the amplifying module.

2. The light source system as claimed in claim 1, wherein the first polarization measurement module includes:

the first beam splitter, configured to split the first return beam into a first reflected beam and a first backward beam; and a first polarization measurement tool, configured to receive the first reflected beam, so as to measure the first polarization angle.

3. The light source system as claimed in claim 2, wherein the first return beam, the first reflected beam and the first backward beam have the same polarization angle.

4. The light source system as claimed in claim 3, further comprising an optical isolator disposed between the light source and the amplifying module, and the optical isolator is configured to block a second return beam caused by the first backward beam from entering the light source when the difference between the first polarization angle and the original polarization angle is substantially 180 degrees.

5. The light source system as claimed in claim 4, wherein the polarization measurement unit further includes a second polarization measurement module, disposed between the optical isolator and the amplifying module, and the second polarization measurement module includes:

a second beam splitter, configured to split the second return beam into the second reflected beam and a second backward beam; and a second polarization measurement tool, configured to receive the second reflected beam, so as to measure the second polarization angle of the second reflected beam.

6. The light source system as claimed in claim 5, wherein the polarization measurement unit further includes a third polarization measurement module, disposed between the optical isolator and the light source, and the third polarization measurement module includes:

a third beam splitter, configured to split a third return beam into a third reflected beam and a third backward beam, wherein the third return beam is emitted from the optical isolator; and a third polarization measurement tool, configured to receive the third reflected beam, so as to measure a third polarization angle of the third reflected beam.

7. A light source system, comprising:

a light source, configured to emit an original light beam, wherein the original light beam has an original polarization angle;

an amplifying module, including reflective mirrors and configured to amplify the original light beam and generate a forward beam for hitting a target, wherein the forward beam has a forward polarization angle that is equal to the original polarization angle;

an optical isolator, disposed between the light source and the amplifying module; and a polarization measurement and monitoring device, configured to measure a first polarization angle of a first return beam and adjust a second polarization angle of a second return beam, wherein the first return beam is reflected from the target, and the second return beam is emitted from the amplifying module;

wherein the polarization measurement and monitoring device further includes a phase adjusting module, the phase adjusting module includes a reflective phase retarder and is configured to adjust the second polarization angle according to the forward polarization angle and the first polarization angle, so that an optical isolator is able to block the second return beam from entering the light source.

8. The light source system as claimed in claim 7, wherein the polarization measurement and monitoring device includes a first polarization measurement module, disposed between the amplifying module and the target, and the first polarization measurement module includes:

a first beam splitter, configured to split the first return beam into a first reflected beam and a first backward beam; and a first polarization measurement tool, configured to receive the first reflected beam, so as to measure the first polarization angle of the first reflected beam.

9. The light source system as claimed in claim 8, wherein the polarization measurement and monitoring device further includes a second polarization measurement module, and the second polarization measurement module includes:

a second beam splitter, configured to split the second return beam into a second reflected beam and a second backward beam; and a second polarization measurement tool, configured to receive the second reflected beam, so as to measure the second polarization angle of the second reflected beam.

10. The light source system as claimed in claim 9, wherein the second polarization measurement module is disposed between the amplifying module and the optical isolator.

11. The light source system as claimed in claim 10, wherein the polarization measurement and monitoring device further includes a third polarization measurement module, disposed between the light source and the optical isolator, wherein the third polarization measurement module includes:

a third beam splitter, configured to split a third return beam into a third reflected beam and a third backward beam, wherein the third return beam is emitted from the optical isolator; and a third polarization measurement tool, configured to receive the third reflected beam, so as to measure a third polarization angle.

12. The light source system as claimed in claim 11, wherein the polarization measurement and monitoring device further includes a monitoring module, coupled to the phase adjusting module, wherein the monitoring module is configured to monitor the original polarization angle, the first polarization angle and the second polarization angle so as to control the phase adjusting module to adjust the second polarization angle.

13. The light source system as claimed in claim 11, wherein the phase adjusting module includes:

the reflective phase retarder; and a driving mechanism, coupled to the reflective phase retarder.

14. The light source system as claimed in claim 8, wherein the polarization measurement and monitoring device further includes a second polarization measurement module which is disposed between the light source and the optical isolator.

15. A polarization angle adjusting method, comprising:

emitting an original light beam by a light source;

amplifying, by an amplifying module, the original light beam to generate a forward beam for hitting a target, wherein the target reflects a first return beam after being hit, and the forward beam has a forward polarization angle;

providing a first polarization measurement module to receive the first return beam so as to measure a first polarization angle of the first return beam;

providing a second polarization measurement module to receive a second return beam so as to measure a second polarization angle of the second return beam, wherein the second return beam is emitted from the amplifying module toward the light source; and controlling a phase adjusting module to adjust the second polarization angle according to the forward polarization angle and the first polarization angle.

16. The polarization angle adjusting method as claimed in claim 15, further comprising:
determining whether a difference between the forward polarization angle and the first polarization angle is within a range; and
wherein the phase adjusting module is controlled to adjust the second polarization angle when the difference between the forward polarization angle and the first polarization angle is not within of the range.

17. The polarization angle adjusting method as claimed in claim 15, further comprising:
providing an optical isolator, wherein the optical isolator is disposed between a light source for emitting the original light beam and the amplifying module.

18. The polarization angle adjusting method as claimed in claim 17, further comprising:
providing a third polarization measurement module;
determining whether the third polarization measurement module receives a third return beam, wherein the third return beam is emitted from the optical isolator.

19. The polarization angle adjusting method as claimed in claim 18, further comprising:
adjusting a polarization parameter of the optical isolator in response to the third polarization measurement module receiving the third return beam.

20. The light source system as claimed in claim 4, wherein the polarization measurement unit further includes a third polarization measurement module, disposed between the optical isolator and the light source, wherein the third polarization measurement module includes a beam splitter.

* * * * *